(12) United States Patent
Cai et al.

(10) Patent No.: US 10,090,849 B1
(45) Date of Patent: Oct. 2, 2018

(54) METHOD FOR PERFORMING ADC PHASE-FREQUENCY RESPONSE TEST

(71) Applicants: National Institute of Metrology, China, Beijing (CN); Beijing University of Chemical Technology, Beijing (CN)

(72) Inventors: Chenguang Cai, Beijing (CN); Ming Yang, Beijing (CN)

( * ) Notice: Subject to any disclaimer, the term of this patent is extended or adjusted under 35 U.S.C. 154(b) by 0 days.

(21) Appl. No.: 15/869,015

(22) Filed: Jan. 11, 2018

(30) Foreign Application Priority Data

Dec. 26, 2017 (CN) .......................... 2017 1 1426319

(51) Int. Cl.
  *H03M 1/10* (2006.01)
  *H03M 1/06* (2006.01)
  *G01R 31/26* (2014.01)
(52) U.S. Cl.
  CPC ...... *H03M 1/1095* (2013.01); *G01R 31/2601* (2013.01); *H03M 1/0626* (2013.01)
(58) Field of Classification Search
  USPC ........................ 341/120; 324/76.23, 607, 610
  See application file for complete search history.

(56) References Cited

U.S. PATENT DOCUMENTS

| 6,891,904 B1 * | 5/2005 | Okada ................. G01R 23/173 324/76.23 |
| 2010/0244811 A1 * | 9/2010 | Pupalaikis ......... G01R 13/0272 324/76.23 |

* cited by examiner

*Primary Examiner* — Howard Williams
(74) *Attorney, Agent, or Firm* — Wayne & Ken, LLC; Tony Hom

(57) ABSTRACT

The present disclosure discloses a method for performing an ADC phase-frequency response test including: measuring a time delay of an analog mixer and low-pass filter (MLPF) in down-converting a specific carrier frequency narrowband frequency modulation (FM) signal; determining an effective sampling frequency required by an ADC for acquiring FM signals; acquiring a high carrier frequency FM signal and a low carrier frequency FM signal before and after down-conversion is performed by the analog MLPF; and demodulating the FM signals that are acquired, correcting an initial phase of a modulation signal of the high carrier frequency FM signal and an initial phase of a modulation signal of the low carrier frequency FM signal, and calculating a phase-frequency response of the ADC at a high carrier frequency. The present disclosure has advantages of a simple test process, a wide frequency range with frequencies and a test simultaneously performed on multiple channels.

6 Claims, 2 Drawing Sheets

METHOD FOR PERFORMING ADC PHASE-FREQUENCY RESPONSE TEST

TECHNICAL FIELD

The present disclosure relates to the field of analog-to-digital converter (ADC) frequency response test technologies, and more specifically to a method for performing an ADC phase-frequency response test.

BACKGROUND

Currently, an ADC is an essential core component of a measurement instrument, and is widely applied in fields such as precision instruments, testing and measurement, space and aviation, and communications. A frequency response is a key feature parameter of the ADC. Currently, an ADC amplitude/frequency response test technology is mature, but there are still a lot of problems to be resolved urgently in a phase-frequency response test technology. An ADC phase-frequency response directly affects real-time quality of acquired signals, and further affects ADC-based measurement instrument performance. In particular, in fields such as real-time motion control, real-time monitoring, and inertial navigation, it is required that real-time quality of signals acquired by an ADC should be higher. By performing an ADC phase-frequency response test, delay correction or compensation can be implemented for the signals acquired by the ADC, so that a measurement error caused by ADC acquisition is reduced. Therefore, research on an ADC phase-frequency response test method is of great significance.

Currently, in an IEEE ADC test standard, it is recommended that an input step signal should be used to implement an ADC phase-frequency response test, and that an ADC output response under the step signal should be acquired and processed to implement the ADC phase-frequency response test. A specific test principle is: acquiring an output response of an ADC under a step signal input within a sufficiently long time; obtaining a phase spectrum of the output response by performing a discrete Fourier transform (DFT), and avoiding discontinuity of phase wrapping in the DFT transform by means of phase unwrapping; and implementing an ADC phase-frequency response test by using an unwrapped continuous phase spectrum. This test method can implement an ADC phase-frequency response test in a specific frequency range. However, an uncertain time delay caused by a difference between a signal start recording time and a step signal conversion recording time has an impact on the method, and the time consumed by the DFT transform increases apparently as a quantity of sampling points of the output response increases. In addition, in this method, a maximum test frequency cannot exceed half of a maximum sampling frequency of the ADC.

Therefore, in view of disadvantages of the conventional ADC phase-frequency response test method, such as limited test precision and a limited test frequency range, the present disclosure provides an ADC phase-frequency response test method featuring high test precision, a high speed, and a wide frequency range with frequencies that may be higher than a maximum sampling frequency of an ADC, and capable of implementing a test on multiple channels simultaneously.

SUMMARY

In view of disadvantages of a conventional ADC phase-frequency response test method, such as limited test precision and a limited test frequency range, embodiments of the present disclosure provide a method for performing an ADC phase-frequency response test. The method includes:

measuring a down-conversion time delay of an analog MLPF: used to determine a time delay of the analog MLPF in down-converting an FM signal, and including: demodulating, based on a PUSAM, a high carrier frequency narrowband FM signal and a low carrier frequency narrowband FM signal acquired by an HDO before and after down-conversion is performed by the analog MLPF, and calculating a down-conversion time delay of the analog MLPF by using initial phases of modulation signals of the two FM signals obtained through demodulation;

selecting an effective sampling frequency for the FM signals: determining an effective sampling frequency required by an ADC for acquiring the high carrier frequency narrowband FM signal and the low carrier frequency narrowband FM signal to ensure an effective spectrum arrangement of the FM signals;

acquiring the FM signals based on the ADC: acquiring, by the ADC with the effective sampling frequency, the high carrier frequency narrowband FM signal and the low carrier frequency narrowband FM signal before and after down-conversion is performed by the analog MLPF; and performing an ADC phase-frequency response test: demodulating, based on the PUSAM, the high carrier frequency narrowband FM signal and the low carrier frequency narrowband FM signal acquired by the ADC, correcting an initial phase of a modulation signal of the high carrier frequency FM signal and an initial phase of a modulation signal of the low carrier frequency FM signal by using the measured down-conversion time delay of the analog MLPF, and calculating a phase-frequency response of the ADC at a high carrier frequency by using corrected initial phases of the modulation signals of the two FM signals.

The method for performing an ADC phase-frequency response test according to the present disclosure has the following beneficial effects:

(1) The method of the present disclosure has advantages in terms of a simple test process, a test simultaneously performed on multiple channels, a wide test frequency range, a high speed, and high test precision.

(2) The method of the present disclosure uses an analog MLPF and a PUSAM to implement an ADC phase-frequency response test, and is applicable to ADCs of different types and different models.

(3) The method of the present disclosure can acquire and demodulate a signal whose frequency is higher than a maximum sampling frequency of an ADC, to satisfy a phase-frequency response test in which a frequency is higher than the maximum sampling frequency of the ADC.

Description of Acronyms

FSG: function signal generator, used to output a frequency modulation signal of a specific carrier frequency and bandwidth;

MLPF: analog mixer and low-pass filter, used to convert a frequency modulation signal of a high carrier frequency into a frequency modulation signal of a low carrier frequency:

HDO: high definition oscilloscope, configured to acquire and store frequency modulation signals;

PUSAM: phase unwrapping sine approximation method, used to obtain an initial phase of a modulation signal of a frequency modulation signal; and ADC: analog-to-digital converter, used to convert an analog signal into a digital signal.

DETAILED DESCRIPTION OF THE DISCLOSURE

The present disclosure provides a method for performing an ADC phase-frequency response test. The following describes the present disclosure in detail with reference to accompanying drawings and specific embodiments, so that a person skilled in the art can better understand the test method of the present disclosure.

Figure 1:
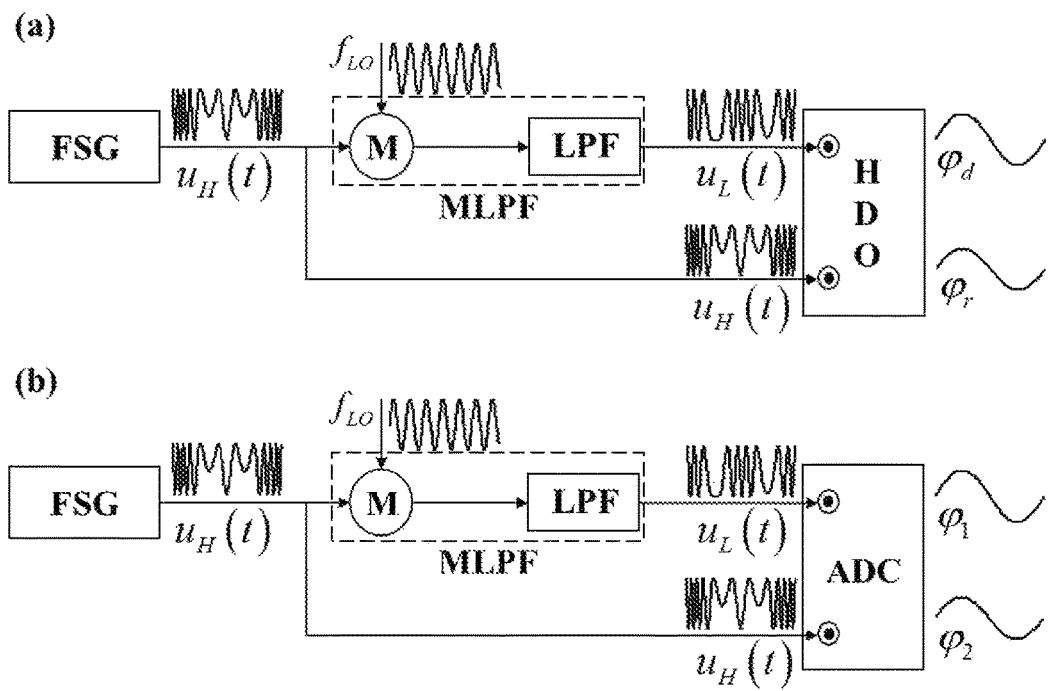
FIG. 1 is a schematic block diagram of a method for performing an ADC phase-frequency response test.

Referring to FIG. 1, FIG. 1 is a schematic block diagram of a method for performing an ADC phase-frequency response test. The method mainly includes the following steps:

demodulating, based on a PUSAM, a high carrier frequency narrowband FM signal and a low carrier frequency narrowband FM signal acquired by an HDO before and after down-conversion is performed by an analog MLPF, and calculating a down-conversion time delay of the analog MLPF by using initial phases of modulation signals of the two FM signals obtained through demodulation;

determining an effective sampling frequency required by an ADC for acquiring the high carrier frequency narrowband FM signal and the low carrier frequency narrowband FM signal to ensure an effective spectrum arrangement of the FM signals;

acquiring, by the ADC by using the effective sampling frequency, the high carrier frequency narrowband FM signal and the low carrier frequency narrowband FM signal before and after down-conversion is performed by the analog MLPF; and demodulating, based on the PUSAM, the high carrier frequency FM signal and the low carrier frequency FM signal acquired by the ADC, correcting an initial phase of a modulation signal of the high carrier frequency FM signal and an initial phase of a modulation signal of the low carrier frequency FM signal by using the measured down-conversion time delay of the analog MLPF, and calculating a phase-frequency response of the ADC at a high carrier frequency by using corrected initial phases of the modulation signals of the two FM signals.

The step of demodulating, based on a PUSAM, a high carrier frequency narrowband FM signal and a low carrier frequency narrowband FM signal acquired by an HDO before and after down-conversion is performed by an analog MLPF specifically includes:

(1) FM signal down-conversion by the analog MLPF: a FSG outputs a narrowband FM signal $u_H(t)$ with carrier frequency of $f_c$. The analog MLPF converts the signal into a low carrier frequency FM signal $u_L(t)$. $u_H(t)$ and $u_L(t)$ acquired by the HDO by using a sampling frequency satisfying the Nyquist sampling theorem are as follows:

$$\begin{cases} u_H(t) = u_H \cos[\varphi_0 + 2\pi f_c t + 2\pi u_m \sin(2\pi f_m t + \varphi_r)] \\ u_L(t) = u_L \cos[\varphi'_0 + 2\pi (f_c - f_{LO}) t + 2\pi u_m \sin(2\pi f_m t + \varphi_d)] \end{cases} \quad (1)$$

where $u_H$, $\varphi_0$, and $f_c$ are respectively a peak voltage, an initial phase, and the carrier frequency of the high carrier frequency FM signal $u_H(t)$; $u_m$, $f_m$, and $\varphi_p$ are respectively a peak value, a frequency, and an initial phase of a modulation signal of $u_H(t)$; $u_L$ and $\varphi'_0$ are respectively a peak voltage and an initial phase of the low carrier frequency FM signal $u_L(t)$, $\varphi_d$ is an initial phase of a modulation signal of $u_L(t)$, and $f_{LO}$ is a sine signal frequency at a local-frequency signal input end of a mixer (M).

(2) FM signal demodulation based on the PUSAM: The HDO acquires $u_H(t)$ and $u_L(t)$ by using the sampling frequency satisfying the Nyquist sampling theorem, uses an orthogonal basis of a digital sine and cosine and a low-pass filter to orthogonalize the $u_H(t)$ and $u_L(t)$ acquired by the HDO, and obtains phases $\varphi_H(t)$ and $\varphi_L(t)$ of the orthogonalized $u_H(t)$ and $u_L(t)$ after phase unwrapping:

$$\begin{cases} \varphi_H(t) = \varphi_0 + 2\pi(f_c - f_H)t + 2\pi u_m \sin(2\pi f_m t + \varphi_r) + k\pi \\ \varphi_L(t) = \varphi_0 + 2\pi(f_c - f_{LO} - f_L)t + 2\pi u_m \sin(2\pi f_m t + \varphi_d) + k\pi \end{cases} \quad (2)$$

where $f_H$ and $f_L$ are respectively orthogonal base frequencies for quadrature $u_H(t)$ and $u_L(t)$, $k\pi$ is a compensating phase, and an integer k is equal to 0, 1, 2, . . . ; and the sine approximation method is used to fit $\varphi_H(t)$ and $\varphi_L(t)$ to obtain the modulation signals of $u_H(t)$ and $u_L(t)$, where $\varphi_H(t)$ and $\varphi_L(t)$ are fitted by using the sine approximation method:

$$\begin{cases} \varphi_H(t) = A_H \cos(2\pi f_m t) - B_H \sin(2\pi f_m t) + C_H t + D_H \\ \varphi_L(t) = A_L \cos(2\pi f_m t) - B_L \sin(2\pi f_m t) + C_L t + D_L \end{cases} \quad (3)$$

where parameters $A_H$ and $B_H$ determine the peak value and the initial phase of the modulation signal of $u_H(t)$, and $C_H$ and $D_H$ are respectively a carrier frequency and a DC offset coefficient of $\varphi_H(t)$; parameters $A_L$ and $B_L$ determine a peak value and the initial phase of the modulation signal of $u_L(t)$, and $C_L$ and $D_L$ are respectively a carrier frequency and a DC offset coefficient of $\varphi_L(t)$; and the fitted parameters are used to calculate the initial phases $\varphi_r$ and $\varphi_d$ of the modulation signals of $u_H(t)$ and $u_L(t)$ as follows:

$$\begin{cases} \varphi_r = \arctan(B_H / A_H) \\ \varphi_d = \arctan(B_L / A_L) \end{cases} \quad (4)$$

(3) Calculating the down-conversion time delay $t_d$ of the analog MLPF by using the initial phases $\varphi_r$ and $\varphi_d$ of the modulation signals of the two FM signals $u_H(t)$ and $u_L(t)$ as follows:

$$t_d = (\varphi_d - \varphi_r)/(2\pi f_m) \quad (5)$$

The step of determining an effective sampling frequency required by an ADC for acquiring the high carrier frequency narrowband FM signal and the low carrier frequency narrowband FM signal specifically includes:

(4) When a maximum sampling frequency of the ADC is higher than twice the carrier frequency of $u_H(t)$, determining that the effective sampling frequency is the maximum sampling frequency of the ADC; or when a maximum sampling frequency of the ADC is lower than twice the carrier frequency of $u_H(t)$, determining, based on a band-pass sampling theorem, that a sampling frequency range for acquiring $u_H(t)$ without spectrum aliasing is:

$$\frac{2f_c + B}{n+1} \le F_s \le \frac{2f_c - B}{n} \quad (6)$$

where a bandwidth B of $u_H(t)$ is:

$$B = 4\pi f_m u_m \quad (7)$$

wherein a value of n is a non-negative integer that does not exceed $\text{int}[(f_c - B/2)/B - 1]$; because $f_c$ is far higher than B, $u_H(t)$ may be approximated to a cosine signal with frequency of $f_c$; as n increases, the sampling frequency range becomes narrower, and the sampling frequency becomes lower; and a sampling frequency range in which a highest sampling frequency is close to but lower than the maximum sampling frequency of the ADC is selected, and guard bands $B_{GL}$ and $B_{GU}$ are introduced to calculate an effective sampling frequency of $u_H(t)$ as follows:

$$\begin{cases} F_{s,c} = \frac{2f_c + B}{n+1} + \Delta F_s \frac{B_{GU}}{B_{GU,max}}, & \text{where } n \text{ is an odd number} \\ F_{s,x} = \frac{2f_c - B}{n} - \Delta F_x \frac{B_{GL}}{B_{GL,max}}, & \text{where } n \text{ is an even number} \end{cases} \quad (8)$$

where $\Delta F_s$ is a maximum frequency variation in a sampling frequency range when the integer n is a determined value, and $B_{GU,max}$ and $B_{GL,max}$ are respectively a maximum upper-limit guard band and a maximum lower-limit guard band in a spectrum for $u_H(t)$ in the sampling frequency range.

The step of testing a phase-frequency response of the ADC at the frequency specifically includes:

(5) acquiring, by the ADC by using the effective sampling frequency $F_{s,e}$, $u_H(t)$ and $u_L(t)$ before and after down-conversion is performed by the analog MLPF, demodulating, $f_c$ based on the PUSAM, $u_L(t)$ and $u_H(t)$ acquired by the ADC, and obtaining the initial phases of the modulation signals of $u_L(t)$ and $u_H(t)$ respectively as follows:

$$\begin{cases} \varphi_1 = \arctan(B_1/A_1) \\ \varphi_2 = \arctan(B_2/A_2) \end{cases} \quad (9)$$

where $A_1$, $B_1$, and $\varphi_1$ are respectively parameters and the initial phase of the modulation signal of $u_L(t)$, and $A_2$, $B_2$, and $\varphi_2$ are respectively parameters and the initial phase of the modulation signal of $u_H(t)$.

(6) Correcting the initial phase $\varphi_1$ of the modulation signal of $u_L(t)$ by using the down-conversion time delay of the analog MLPF measured in step (3), wherein a corrected initial phase $\varphi_{1r}$ is:

$$\varphi_{1r} = \varphi_1 - 2\pi f_m t_d \quad (10)$$

(7) Calculating the phase-frequency response of the ADC at the frequency $f_c$ by using the initial phase $\varphi_2$ of the modulation signal of $u_H(t)$ and the corrected initial phase $\varphi_{1r}$ of the modulation signal of $u_L(t)$ as follows:

$$\varphi_{ADC} = (\varphi_2 - \varphi_{1r}) f_c / f_m \quad (11)$$

wherein $\varphi_{ADC}$ is the phase-frequency response of the ADC at the frequency $f_c$, and $f_c$ may be higher than the maximum sampling frequency of the ADC.

Figure 2:
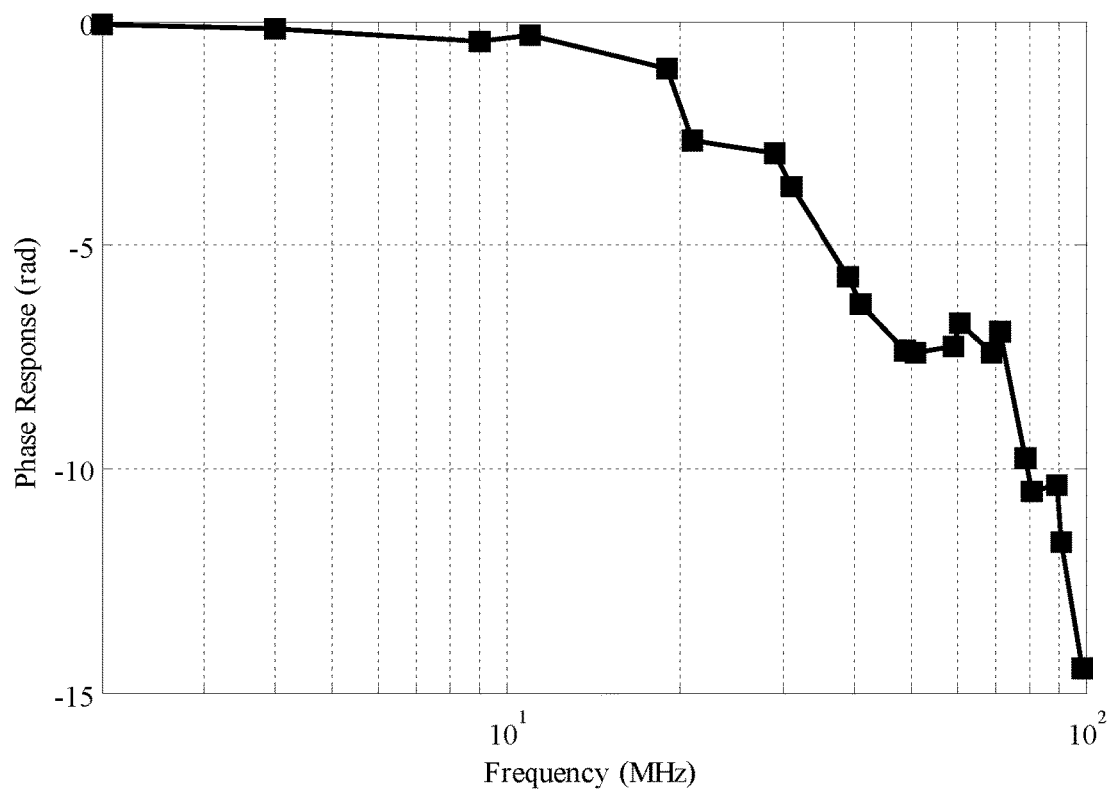
FIG. 2 is an experiment result diagram of an ADC phase-frequency response test in a specific embodiment of a method of the present disclosure.

Referring to FIG. 2, FIG. 2 is an experiment result diagram of an ADC phase-frequency response test in a specific embodiment of a method of the present disclosure. Specific apparatus parameters in this embodiment are: a RIGOL function signal generator (FSG) DG4202 with maximum output frequency of 200 MHz, a mini-circuit mixer (M) with input frequency range from 0.5 MHz to 500 MHz, a mini-circuit low-pass filter (LPF) with cutoff frequency of 2.5 MHz, a TELEDYNE high definition oscilloscope (HDO) 6104 with maximum sampling frequency and bandwidth of both I GHz, and an ADLINK ADC 9816 with maximum sampling frequency of 10 MHz. In this test, a carrier frequency range of FM signals output by the FSG is 2 MHz to 99 MHz, a bandwidth thereof is approximately 5 kHz constantly, and the carrier frequencies are far higher than the bandwidth thereof. A carrier frequency of an FM signal down-converted by the analog MLPF is constantly 0.2 MHz. An effective sampling frequency selected for acquiring FM signals of different carrier frequencies is 10 MHz. According to a test result, it can be known that the test method of the present disclosure implements an ADC phase-frequency response test in a range of 2 MHz to 99 MHz, and that a maximum test frequency thereof is far higher than a maximum sampling frequency of the ADC. In addition, for testing phase-frequency responses of ADCs of different types and models, a down-conversion time delay of the analog MLPF needs to be measured only at the first time.

A specific embodiment of the method of the present disclosure is described in detail above, so that a person skilled in the art can understand the method. The method is not intended to limit the application scope of the present disclosure. A person skilled in the art can make a series of optimizations, improvements, equivalent modifications, and the like on a basis of the present disclosure. Therefore, the protection scope of the present disclosure shall be defined by the appended claims.

What is claimed is:

1. A method for performing an analog-to-digital converter (ADC) phase-frequency response test, wherein the method comprises the following steps:

demodulating, based on a phase unwrapping sine approximation method (PUSAM), a high carrier frequency narrowband FM signal and a low carrier frequency narrowband FM signal acquired by an HDO before and after down-conversion is performed by an analog MLPF, and calculating a down-conversion time delay of the analog MLPF by initial phases of modulation signals of the two FM signals obtained through demodulation;

determining an effective sampling frequency required by an ADC for acquiring the high carrier frequency narrowband FM signal and the low carrier frequency narrowband FM signal to ensure an effective spectrum arrangement of the FM signals;

simultaneously acquiring, by the ADC with the effective sampling frequency the high carrier frequency narrowband FM signal and the low carrier frequency narrowband FM signal before and after down-conversion is performed by the analog MLPF; and demodulating, based on the PUSAM, the high carrier frequency FM signal and the low carrier frequency FM signal that are acquired by the ADC, correcting an initial phase of a modulation signal of the high carrier frequency FM signal and an initial phase of a modulation signal of the low carrier frequency FM signal by the measured down-conversion time delay of the analog MLPF, and calculating a phase-frequency response of the ADC at a high carrier frequency by corrected initial phases of the modulation signals of the two FM signals.

2. The method for performing an ADC phase-frequency response test according to claim 1, wherein
the step of demodulating, based on a PUSAM, a high carrier frequency narrowband FM signal and a low carrier frequency narrowband FM signal acquired by an HDO before and after down-conversion performed by an analog MLPF specifically comprises:
(1) the FM signal down-conversion by the analog MLPF;
a function signal generator (FSG) is configured to output a specific carrier frequency narrowband FM signal as follows:

$$u_H(t) = u_H \cos[\varphi_0 + 2\pi f_c t + 2\pi u_m \sin(2\pi f_m t + \varphi_r)],$$

wherein $u_H$, $\varphi_0$, and $f_c$ are respectively a peak voltage, an initial phase, and a carrier frequency of $u_H(t)$; $u_m$, $f_m$, and $\varphi_c$ are respectively a peak value, a frequency, and an initial phase of a modulation signal of the FM signal $u_H(t)$; and $u_H(t)$ is down-converted by the analog MLPF into a low carrier frequency FM signal:

$$u_L(t) = u_L \cos[\varphi'_0 + 2\pi(f_c - f_{LO})t + 2\pi u_m \sin(2\pi f_m t + \varphi_d)],$$

wherein $u_L$ and $\varphi'_0$ are respectively a peak voltage and an initial phase of $u_L(t)$, $\varphi_d$ is an initial phase of a modulation signal of $u_L(t)$, and $f_{LO}$ is a sine signal frequency at a local-frequency signal input end of a mixer (M);
(2) the FM signal demodulation based on the PUSAM
the HDO acquires $u_H(t)$ and $u_L(t)$ by using a sampling frequency satisfying a Nyquist sampling theorem, orthogonalizes the acquired $u_H(t)$ and $u_L(t)$ by using an orthogonal basis of a digital sine and cosine and a low-pass filter, and obtains phases $\varphi_H(t)$ and $\varphi_L(t)$ of the orthogonalized $u_H(t)$ and $u_L(t)$ after phase unwrapping:

$$\begin{cases} \varphi_H(t) = \varphi_0 + 2\pi(f_c - f_H)t + 2\pi u_m \sin(2\pi f_m t + \varphi_r) + k\pi \\ \varphi_L(t) = \varphi_0 + 2\pi(f_c - f_{LO} - f_L)t + 2\pi u_m \sin(2\pi f_m t + \varphi_d) + k\pi \end{cases},$$

wherein $f_H$ and $f_L$ are respectively orthogonal base frequencies for orthogonalizing $u_H(t)$ and $u_L(t)$, $k\pi$ is a compensating phase, and an integer $k$ is equal to 0, 1, 2, •••; and a sine approximation method is used to fit $\varphi_H(t)$ and $\varphi_L(t)$ to obtain the modulation signals of $u_H(t)$ and $u_L(t)$, wherein a fitting form of the sine approximation method is:

$$\begin{cases} \varphi_H(t) = A_H \cos(2\pi f_m t) - B_H \sin(2\pi f_m t) + C_H t + D_H \\ \varphi_L(t) = A_L \cos(2\pi f_m t) - B_L \sin(2\pi f_m t) + C_L t + D_L \end{cases},$$

wherein parameters $A_H$ and $B_H$ determine the peak value and the initial phase of the modulation signal of $u_H(t)$, and $C_H$ and $D_H$ are respectively a carrier frequency and a DC offset coefficient of $\varphi_H(t)$; parameters $A_L$ and $B_L$ determine a peak value and the initial phase of the modulation signal of $u_L(t)$, and $C_L$ and $D_L$ are respectively a carrier frequency and a DC offset coefficient of $\varphi_L(t)$; and the fitted parameters are used to calculate the initial phases $\varphi_r$ and $\varphi_d$ of the modulation signals of $u_H(t)$ and $u_L(t)$ as follows:

$$\begin{cases} \varphi_r = \arctan(B_H / A_H) \\ \varphi_d = \arctan(B_L / A_L) \end{cases}.$$

3. The method for performing an ADC phase-frequency response test according to claim 2, wherein
the down-conversion time delay $t_d$ of the analog MLPF is calculated by using the initial phases $\varphi_r$ and $\varphi_d$ of the modulation signals of the two FM signals as follows:

$$t_d = (\varphi_d - \varphi_r)/(2\pi f_m).$$

4. The method for performing an ADC phase-frequency response test according to claim 1, wherein
the step of determining the effective sampling frequency required by the ADC for acquiring the high carrier frequency narrowband FM signal and the low carrier frequency narrowband FM signal specifically comprises:
when a maximum sampling frequency of the ADC is higher than twice of a carrier frequency $u_H(t)$, determining that the effective sampling frequency is the maximum sampling frequency of the ADC; or when a maximum sampling frequency of the ADC is lower than twice of a carrier frequency $u_H(t)$, determining, based on a band-pass sampling theorem, that a sampling frequency range for acquiring $u_H(t)$ without spectrum aliasing is:

$$\frac{2f_c + B}{n+1} \leq F_s \leq \frac{2f_c - B}{n},$$

wherein a bandwidth B of $u_H(t)$ is:

$$B = 4\pi f_m u_m,$$

wherein n is a non-negative integer that does not exceed $\text{int}[(f_c - B/2)/B - 1]$; because $f_c$ is far higher than B, $u_H(t)$ may be approximated to a cosine signal with frequency of $f_c$; as n increases, the sampling frequency range becomes narrower, and the sampling frequency becomes lower; and a sampling frequency range in which a highest sampling frequency is close to but lower than the maximum sampling frequency of the ADC is selected, and guard bands $B_{GL}$ and $B_{GU}$ are introduced to calculate an effective sampling frequency of $u_N(t)$ as follows:

$$\begin{cases} F_{s,c} = \dfrac{2f_c + B}{n+1} + \Delta F_s \dfrac{B_{GU}}{B_{GU,max}}, & \text{wherein } n \text{ is an odd number} \\ F_{x,c} = \dfrac{2f_c - B}{n} - \Delta F_s \dfrac{B_{GL}}{B_{GL,max}}, & \text{wherein } n \text{ is an even number} \end{cases},$$

wherein $\Delta F_s$ is a maximum frequency variation in a sampling frequency range when the integer n is a determined value, and $B_{GU,max}$ and $B_{GL,max}$ are respectively a maximum upper-limit guard band and a maximum lower-limit guard band in a spectrum for $u_H(t)$ in the sampling frequency range.

5. The method for performing an ADC phase-frequency response test according to claim 1, wherein
the ADC collects $u_H(t)$ and $u_L(t)$ before and after down-conversion is performed by the analog MLPF, demodulates by using an effective sampling frequency $F_{s,e}$, $u_L(t)$ and $u_H(t)$ acquired by the ADC based on the PUSAM, and obtains initial phases of modulation signals of $u_L(t)$ and $u_H(t)$ respectively as follows:

$$\begin{cases} \varphi_1 = \arctan(B_1/A_1) \\ \varphi_2 = \arctan(B_2/A_2) \end{cases},$$

wherein $A_1$, $B_1$, and $\varphi_1$ are respectively parameters and an initial phase of a modulation signal of $u_L(t)$, and $A_2$, $B_2$, and $\varphi_2$ are respectively parameters and an initial phase of a modulation signal of $u_H(t)$; and the initial phase $\varphi_t$ of the modulation signal of $u_L(t)$ is corrected by using the measured down-conversion time delay of the analog MLPF, wherein a corrected initial phase $\varphi_{1r}$ is:

$\varphi_{1r} = \varphi_1 - 2\pi f_m t_d$.

6. The method for performing an ADC phase-frequency response test according to claim 5, wherein
the phase-frequency response of the ADC at the frequency $f_c$ is calculated by using the corrected initial phase $\varphi_{1r}$ of the modulation signal of $u_L(t)$ and the initial phase $\varphi_2$ of the modulation signal of $u_H(t)$ as follows:

$\varphi_{ADC} = (\varphi_2 - \varphi_{1r}) f_c / f_m$, wherein $\varphi_{ADC}$ is the phase-frequency response of the ADC at the frequency $f_c$, and $f_c$ is higher than the maximum sampling frequency of the ADC.

* * * * *